United States Patent
Bouisse et al.

(10) Patent No.: US 9,270,233 B2
(45) Date of Patent: Feb. 23, 2016

(54) AMPLIFIER CIRCUITS

(71) Applicant: NXP B.V., Eindhoven (NL)

(72) Inventors: Gerard Jean-Louis Bouisse, Toulouse (FR); Xavier Moronval, Colomiers (FR)

(73) Assignee: Samba Holdco Netherlands B.V., Eindhoven (NL)

( * ) Notice: Subject to any disclaimer, the term of this patent is extended or adjusted under 35 U.S.C. 154(b) by 27 days.

(21) Appl. No.: 14/054,665

(22) Filed: Oct. 15, 2013

(65) Prior Publication Data

US 2014/0179243 A1  Jun. 26, 2014

(30) Foreign Application Priority Data

Oct. 16, 2012 (EP) .................................. 12290346

(51) Int. Cl.

| | |
|---|---|
| *H03F 1/00* | (2006.01) |
| *H03F 1/42* | (2006.01) |
| *H01L 23/64* | (2006.01) |
| *H01L 23/66* | (2006.01) |
| *H03F 1/56* | (2006.01) |
| *H03F 3/193* | (2006.01) |
| *H03F 3/24* | (2006.01) |
| *H04W 88/08* | (2009.01) |

(52) U.S. Cl.
CPC ............... *H03F 1/42* (2013.01); *H01L 23/642* (2013.01); *H01L 23/66* (2013.01); *H03F 1/56* (2013.01); *H03F 3/193* (2013.01); *H03F 3/245* (2013.01); *H04W 88/08* (2013.01); *H01L 2223/6644* (2013.01); *H01L 2223/6666* (2013.01); *H01L 2224/48091* (2013.01); *H01L 2224/49175* (2013.01); *H01L 2924/3011* (2013.01); *H03F 2200/222* (2013.01); *H03F 2200/387* (2013.01)

(58) Field of Classification Search
CPC ................................................... H03F 2200/387
USPC ......................................... 330/65, 66, 67, 68
See application file for complete search history.

(56) References Cited

U.S. PATENT DOCUMENTS

| | | | |
|---|---|---|---|
| 6,072,211 A | 6/2000 | Miller et al. | |
| 6,229,408 B1 | 5/2001 | Jovanovich et al. | |
| 7,986,184 B2 * | 7/2011 | Besling et al. | .................. 330/67 |
| 2004/0041634 A1 | 3/2004 | Sugiura | |
| 2004/0178854 A1 | 9/2004 | Inoue et al. | |

(Continued)

FOREIGN PATENT DOCUMENTS

| | | |
|---|---|---|
| EP | 0475116 | 3/1992 |
| EP | 1347572 | 9/2003 |

(Continued)

OTHER PUBLICATIONS

European Search Report for European Patent Appln. No. EP 12290346.1.
Extended European Search Report for Patent Appl. No. 12290347.9.

*Primary Examiner* — Steven J Mottola
(74) *Attorney, Agent, or Firm* — McDonnell Boehnen Hulbert & Berghoff LLP (57) ABSTRACT

Radio Frequency (RF) amplifier circuits are disclosed which may exhibit improved video/instantaneous bandwidth performance compared to conventional circuits. For example, disclosed RF amplifier circuits employ various concepts for reducing an overall circuit inductance or enabling an increase in capacitance for a given circuit size.

14 Claims, 8 Drawing Sheets

(56) References Cited

U.S. PATENT DOCUMENTS

2014/0104004 A1 4/2014 Bouisse et al.
2014/0179243 A1 6/2014 Bouisse

FOREIGN PATENT DOCUMENTS

GB 2118371 10/1983
WO WO 2009130544 A1 * 10/2009

* cited by examiner

AMPLIFIER CIRCUITS

CROSS-REFERENCE TO RELATED APPLICATIONS

This application claims the priority under 35 U.S.C. §119 of European patent application no. 12290346.1, filed on Oct. 16, 2012, the contents of which are incorporated by reference herein.

This invention relates to the field of amplifier circuits, and more particularly to radio frequency power amplifier circuits.

Power amplifier circuits are widely used in Radio Frequency (RF) applications. The video bandwidth, or instantaneous bandwidth, of a RF power amplifier represents the ability of the RF power amplifier to instantaneously amplify a linear signal (i.e. a signal with a variable envelope) without asymmetrical distortion.

Thus, the instantaneous bandwidth represents the broadest modulating signal that can be handled instantaneously by a RF power amplifier without asymmetrical distortion.

Asymmetry in signal distortion is generally unacceptable because it is difficult to correct.

For mobile communication applications, signal modulations have become increasingly wideband over the past years (from 200 kHz to 75 MHz today and >100 MHz in the future) so as to achieve higher data rates. Video bandwidth is therefore of growing importance and typically a discriminating factor in the field of amplification for mobile communication applications.

Figure 1:
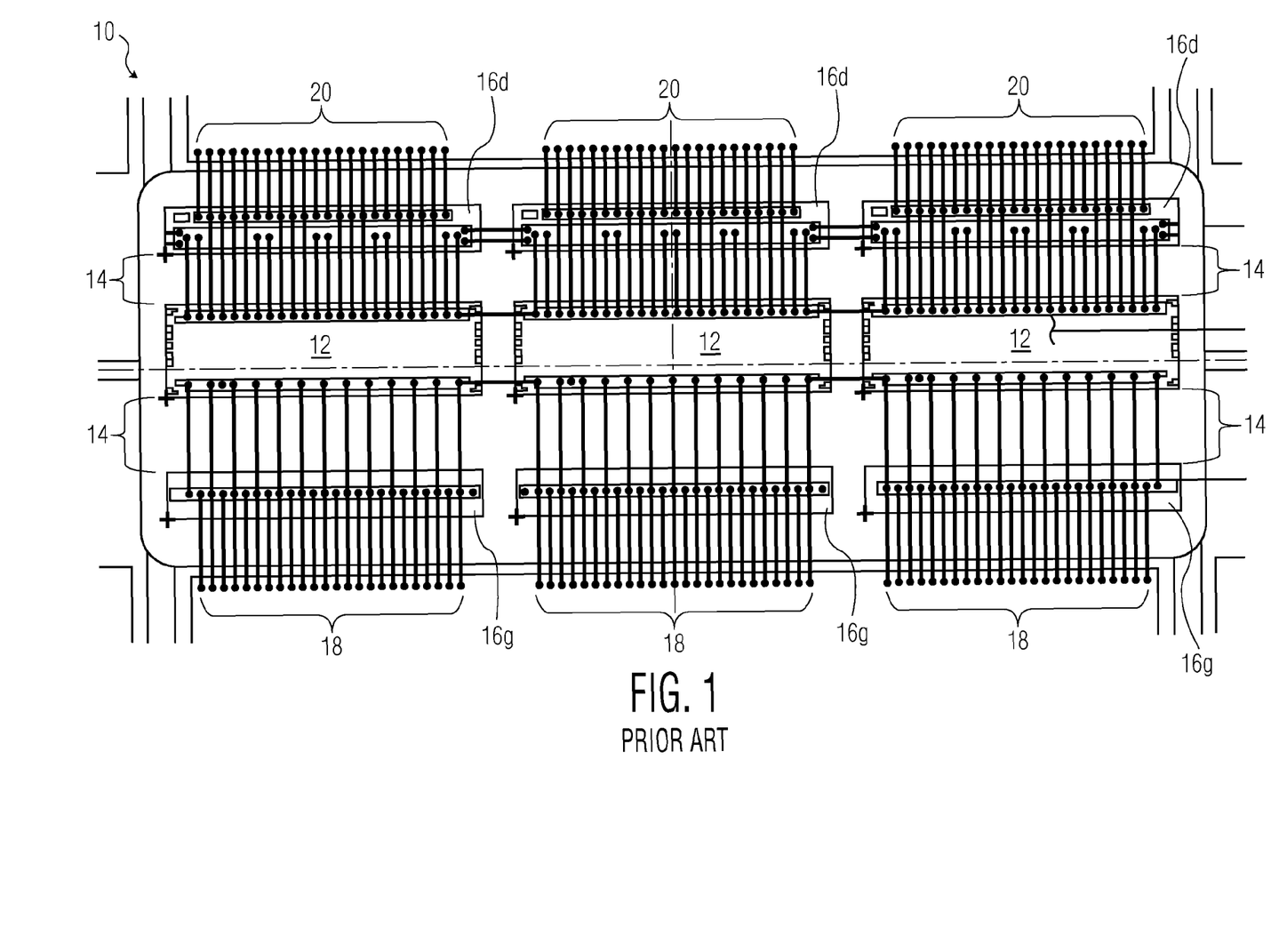
FIG. 1 is a schematic diagram of a conventional discrete (i.e. packaged) RF amplifier circuit.

FIG. 1 is a schematic diagram of a conventional discrete (i.e. packaged) RF-LDMOS power amplifier 10. The amplifying transistors are located on silicon dies 12 provided within the package. The package 10 further includes a matching network consisting of bond wires 14 and discrete capacitors 16. Gate input leads 18 are connected to the transistor gates via gate-side capacitors 16g and drain output leads 20 are connected to the transistor drains via drain-side capacitors 16d.

Figure 2:
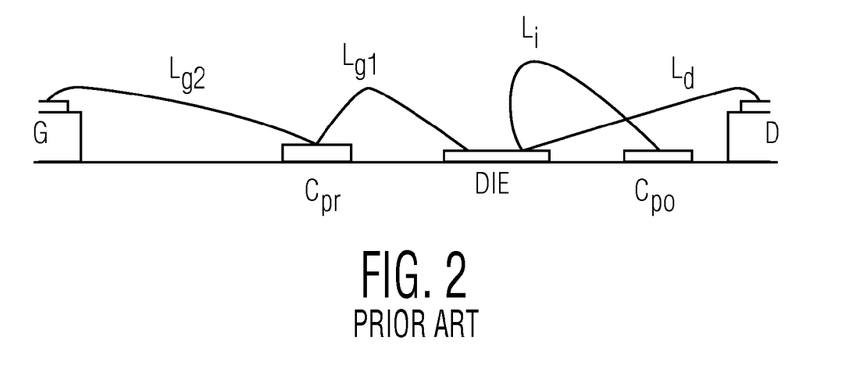
FIG. 2 illustrates a set of bond-wire connections between capacitors and a die of the device of FIG. 1.

Turning to FIG. 2, there is illustrated a set of bond-wire connections between capacitors and a die of the device of FIG. 1. The bond-wire connection between the gate-side capacitor 16g (Cpr) and the gate terminal G of the package has an inductance denoted Lg2, and the bond-wire connection between the gate-side capacitor 16 (Cpr) and the gate of the transistor on the die (DIE) has an inductance denoted Lg1. Similarly, the bond-wire connection between the drain of the transistor on the die (DIE) and the drain terminal D of the package has an inductance denoted Ld, and the bond-wire connection between the drain-side capacitor 16d (Cpo) and the drain of the transistor on the die (DIE) has an inductance denoted Li. An equivalent circuit diagram of the device of FIG. 1 illustrating the relative connections of the capacitances and inductances is provided in FIG. 3. From this, it will be seen that a capacitance Cpkg is present at each of the gate and drain terminals of the package (connected in parallel with the other capacitances), and that a source inductance Ls is associated with the source terminal of the package 10.

The conventional implementation described above leads to insufficient results in terms of video bandwidth (VBW) performance, signal distortion, and linearity degradation, and ultimately may not meet the minimum requirements imposed by modern telecommunications standards.

Proposed are concepts for improving VBW performance of a RF amplifier circuit.

According to an aspect of the invention there is provided a packaged radio frequency amplifier circuit according to claim 1.

Embodiments may employ the concept of embedding a large value capacitance (in the µF or 10 µF range, for example) in a discrete (i.e. packaged) RF amplifier circuit so that is connected as close as practically possible to the amplifying device with a very low inductive connection. Such embodiments may provide for a large value capacitance by making use of available space inside of the packaging which is otherwise not used in conventional discrete amplifier circuits. For example, the inside downwardly facing surface of a packaging lid may be used to accommodate the formation of a capacitor which is then connected to the RF amplifier circuit.

According to an aspect of the invention there is provided a packaged radio frequency amplifier circuit according to claim 8.

Embodiments of the invention may have an overall reduced inductance L when compared to conventional arrangements, thus enabling an increase in the VBW.

Examples of the invention will now be described in detail with reference to the accompanying drawings, in which.

Figure 3:
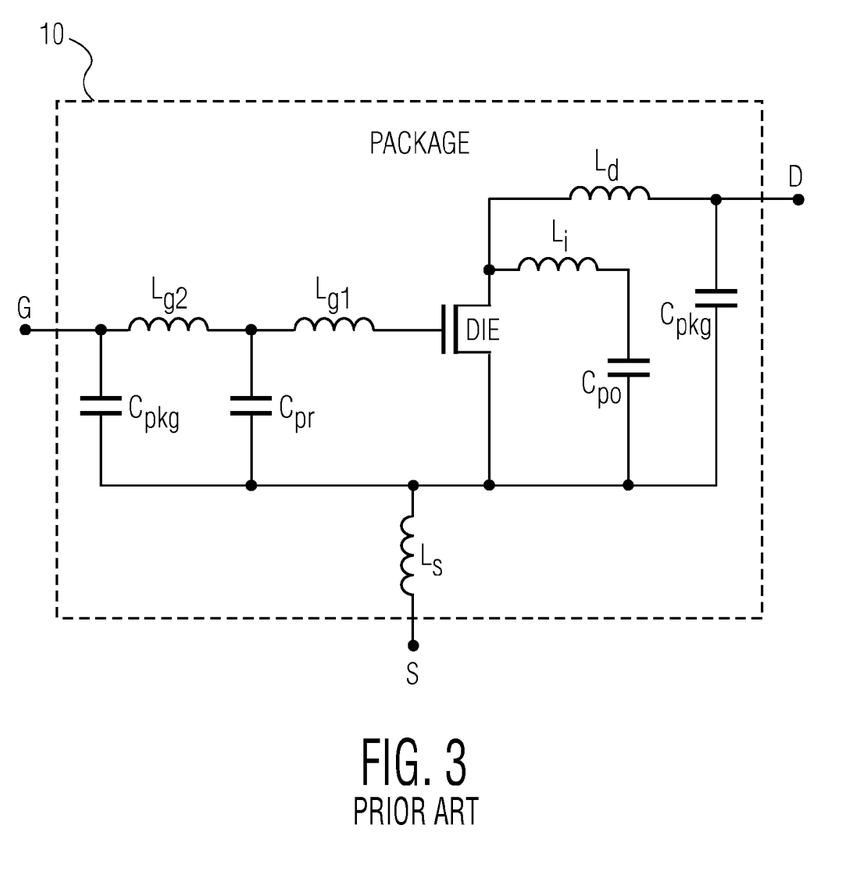
FIG. 3 is an equivalent circuit diagram of the device of FIG. 1 illustrating the relative connections of the capacitances and inductances.
Figure 4:
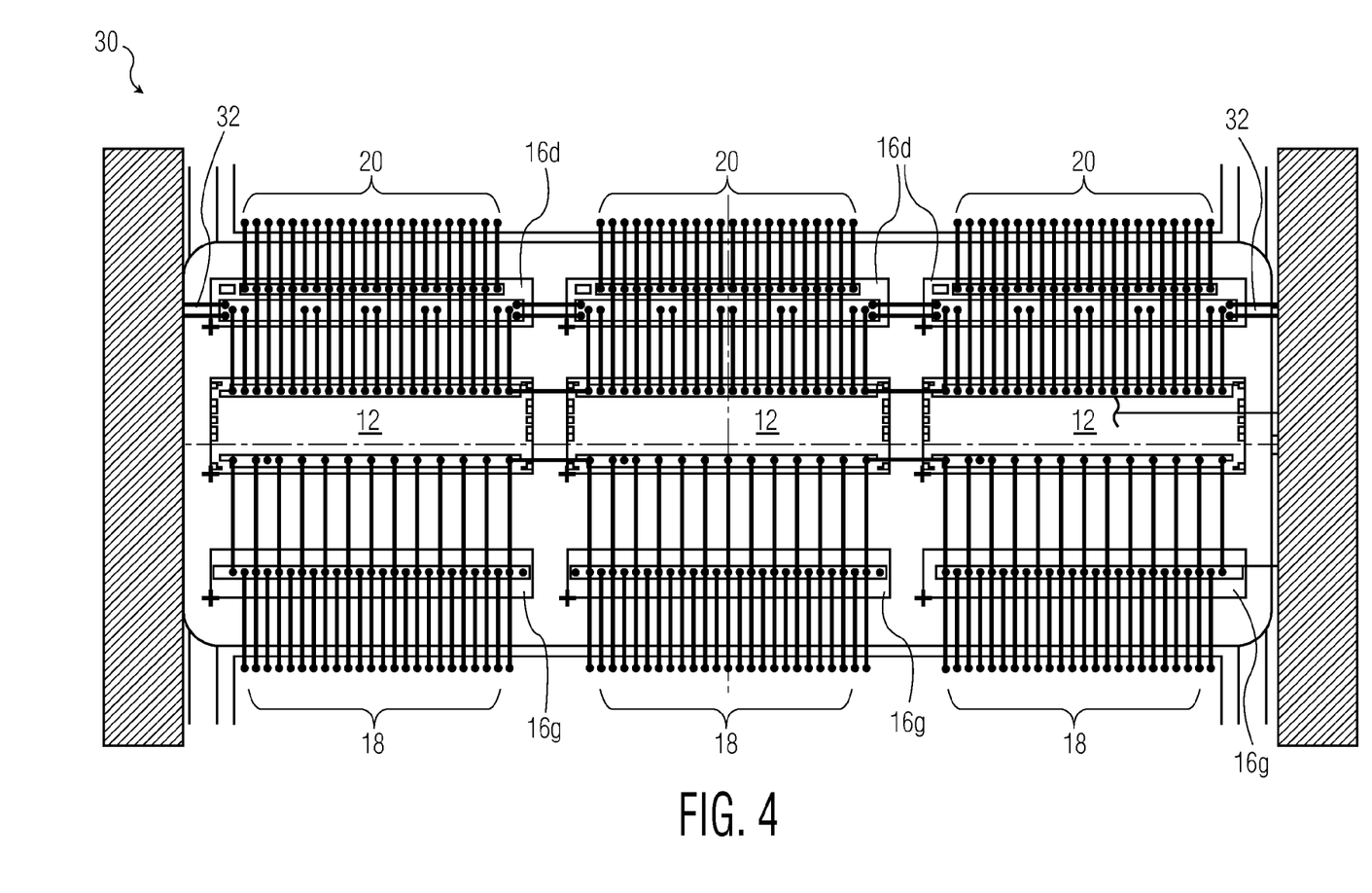
FIG. 4 is a schematic diagram of a discrete RF amplifier circuit according to an embodiment of the invention.

FIG. 4 is a schematic diagram of a discrete RE amplifier circuit 30 according to an embodiment of the invention. The embodiment of FIG. 4 differs from the conventional arrangement shown in FIG. 1 in that it employs extra DC output leads 32 connected to the drain-side decoupling capacitors 16d. This provision of extra electrical connections to the drain-side capacitors 16d results in extra inductances arranged in parallel, thus resulting in a decrease of the overall inductance L of the circuit 30. This resultant decrease in L increase the video bandwidth of the circuit 30 when compared to the conventional arrangement of FIG. 1. Specifically, the improvement (i.e. increase) in the video bandwidth provided by the circuit of FIG. 3 is around 70%.

Implementing the present invention is:
straightforward (slight modification of existing packages)
cost effective (almost free)
Sufficient to reach short term required VBW numbers, even for very high power transistors (200 W in this example).
Large Value Capacitance Provision FIG. 5 is an electrical representation of a conventional output matching structure as it is used in an RF simulator.

Figure 5:
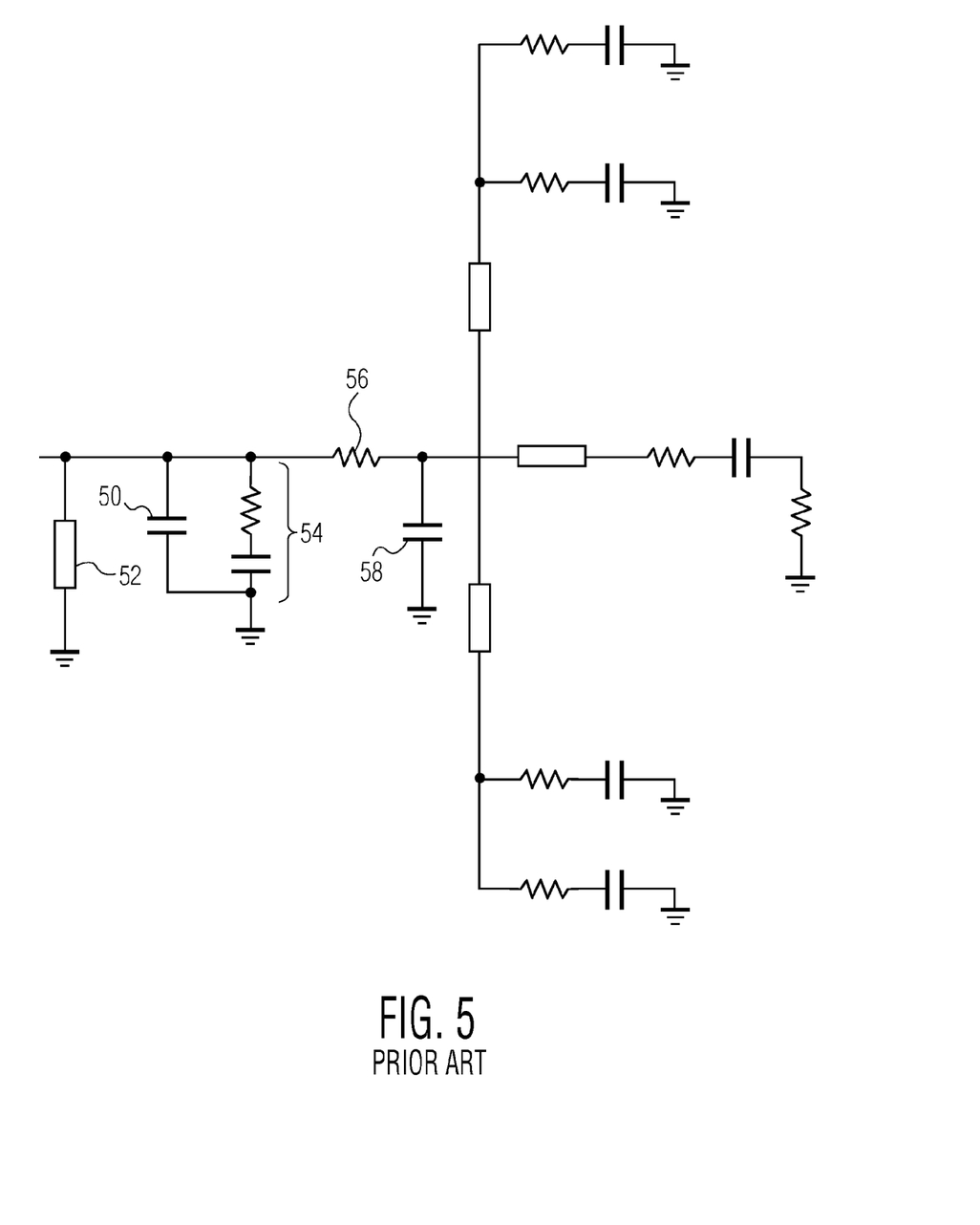
FIG. 5 is an electrical representation of a conventional output matching structure as it is used in an RF simulator.
Figure 6A:
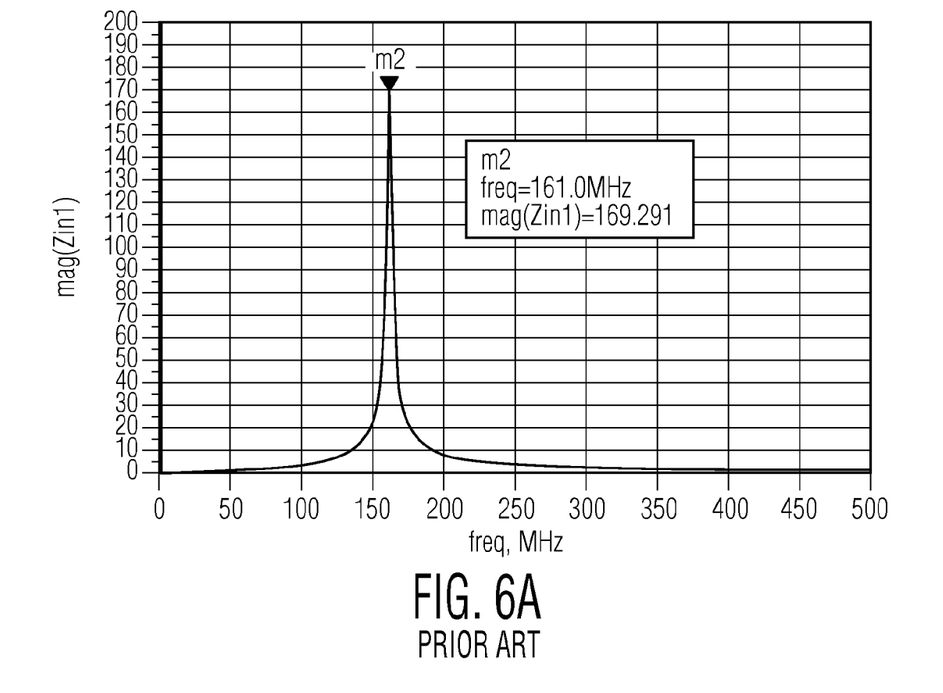
FIG. 6a is a graph illustrating a variation of the magnitude of baseband impedance with operating frequency for the RF amplifier circuit of FIG. 5.
Figure 6B:
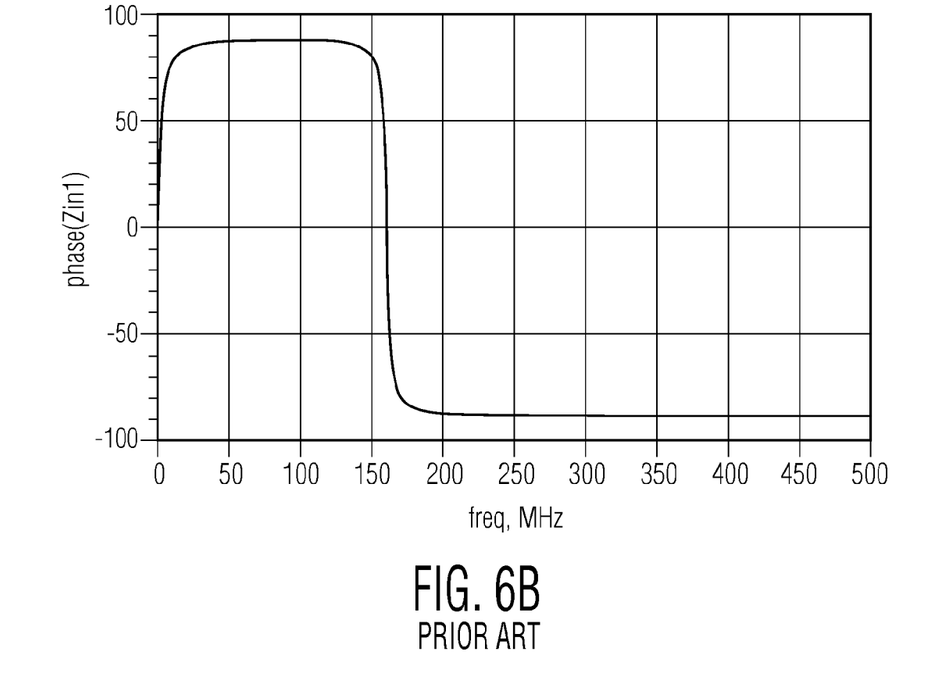
FIG. 6b is a graph illustrating a variation of the phase of baseband impedance with operating frequency for the conventional RF amplifier circuit of FIG. 5.

From left to right, the extreme left element 50 is a port, and represents the current source of the device (this is the reference plane for the impedance simulations from FIGS. 6A and 6B) The shunt capacitance 52 on its right, represents Cds, the shunt capacitance drain to source from the FET. Then the next three elements are matching elements inside the package (the series LC network 54 to ground, and the series inductance 56). The next shunt capacitance 58, represents the package lead.

On the right side of the lead, is represented the output matching network, to 50 ohms, on the PCB, and the connection to the power supply, through a quarter wave element, and RF and baseband decoupling shunt capacitors.

Thus, in other words, FIG. 5 represents an electrical circuit, as used in a simulator, describing the typical passive elements from the current source of an active device to 50 ohms, through internal and external (to the package) matching elements, as well as connection to the DC power supply.

FIG. 6a is a graph illustrating a variation of the magnitude of baseband impedance with operating frequency for the RF amplifier circuit of FIG. 5. FIG. 6b is a graph illustrating a variation of the phase of baseband impedance with operating frequency for the conventional RF amplifier circuit of FIG. 5. FIGS. 6a and 6b thus illustrate the frequency response of the conventional RF amplifier circuit of FIG. 5. From FIGS. 6a and 6b it will be seen that the resonant frequency of the conventional RF amplifier circuit of FIG. 5 is 161 MHz. This does not meet desired video bandwidth requirements for modern applications like mobile telecommunications.

To move the resonant frequency to a higher frequency, embodiments employ the concept of embedding a large value capacitance (in the μF or 10 μF range, for example) in an RF amplifier circuit package so that is connected as close as practically possible to the amplifying device with a very low inductive connection. Here, the intention is to minimise the electrical distance (in other words, the inductance) between the baseband decoupling capacitance (which is arranged to be of very large value and conventionally external to the package) and the current source of the amplifying device. This defines the baseband termination resonance presented to the current source of the device, which is responsible for limiting video bandwidth.

Several considerations occur when taking such an approach. The first consideration relates to the value of capacitance that can be embedded, taking into account all constraints (such as voltage rating, form factor, available package space, etc. . . . ). The second consideration relates to the associated inductance to connect the embedded capacitance to the rest of the circuit.

Embodiments address these considerations by making use of the available space above circuit inside of the package (which is conventionally currently used by a cover), more specifically by connecting an inner electrode provided on the inner side of the package cover down to the metallised portion of the alumina ring (and then through wirebonds to the RF decoupling capacitance on the drains side of the amplifier circuit). In other words, a large value capacitance can be attained by making use of the available area of the inside surface of the package cover.

Figure 7:
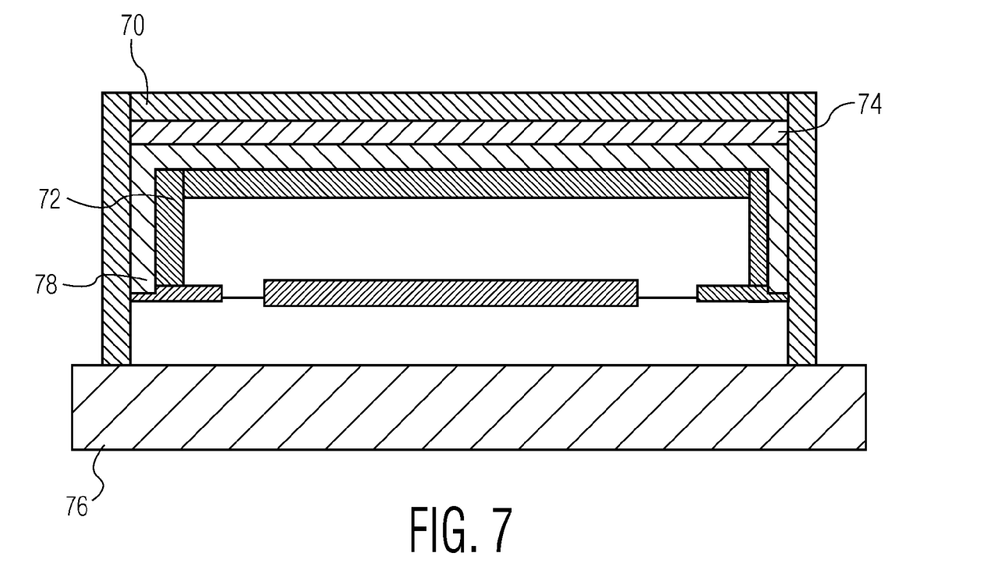
FIG. 7 is a cross-sectional diagram of a packaged RF amplifier circuit according to an embodiment of the invention.

Turning to FIG. 7, there is shown a cross-sectional drawing of a packaged RF amplifier circuit according to an embodiment of the invention.

The bottom (i.e. downwardly facing) surface of the package cover is covered with top 70 and bottom 72 electrode layers with a dielectric layer 74 sandwiched therebetween. The top electrode layer 70 is electrically connected to the flange 76 of the package (i.e. the grounding surface), and the bottom electrode layer 72 is electrically connected to the $Al_2O_3$ conducting ring 78 of the packaged circuit. It will be understood that the electrode layers 70, 72 and the dielectric layer 74 form a capacitor. Due to the capacitor employing the large surface area of the package cover, the value of the capacitor is higher than that which could be formed within the available space between the components of packaged circuit. By way of example, the large value capacitance formed by making use of the package cover according to an embodiment may be greater than 0.5 μF, preferably greater than 1 μF, more preferably greater than 3 μF, and even more preferably greater than 10 μF range.

Figure 8:
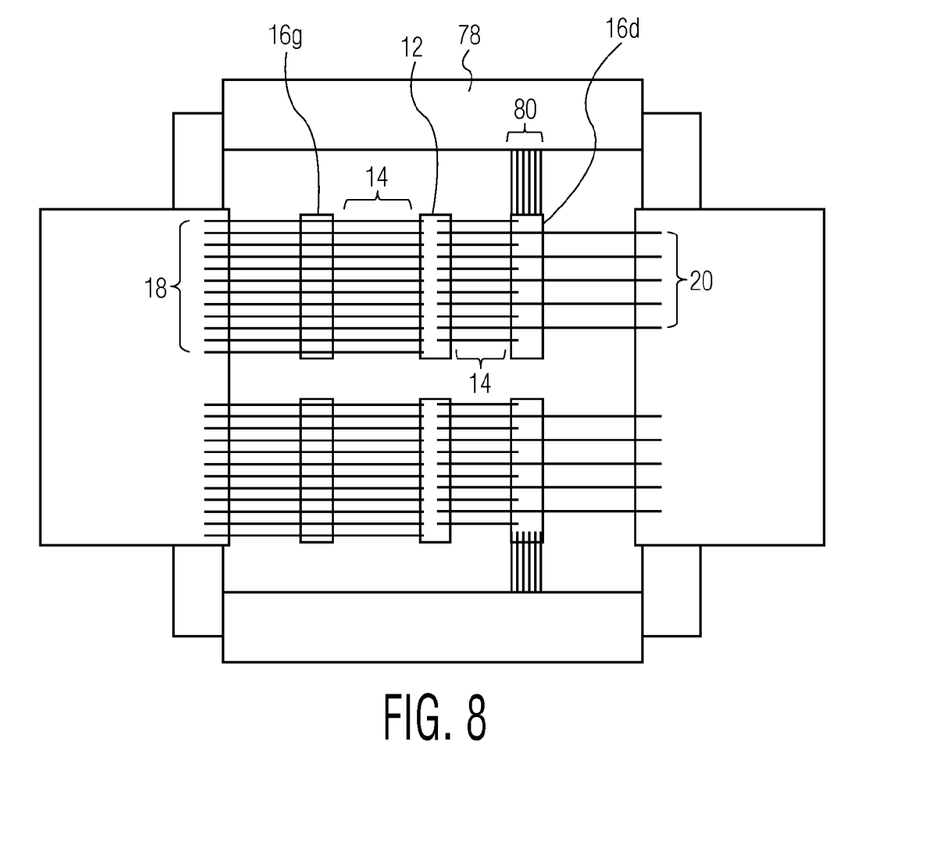
FIG. 8 is a plan view of the packaged RF amplifier circuit of FIG. 7, wherein the cover of the package has been removed.

Turning to FIG. 8, the large value capacitance is then connected, via the metallised portion of the alumina conducting ring 78, to the RF decoupling capacitance 16d on the drain side of the amplifier circuit using a plurality of parallel wire bonds 80. This arrangement provides a short connecting inductance to the amplifier circuit. Specifically, connection of the capacitance from the horizontal inside (i.e. downwardly facing) surface of the package cover to the alumina ring 78 is via a large microstrip-like connection which has low impedance, and hence a small inductance in the pH range. Connection from the alumina ring 78 to the RF decoupling capacitance 16d on the drain side of the amplifier circuit is then made via a plurality of bond wires 80, which also realises a small inductance.

Figure 9:
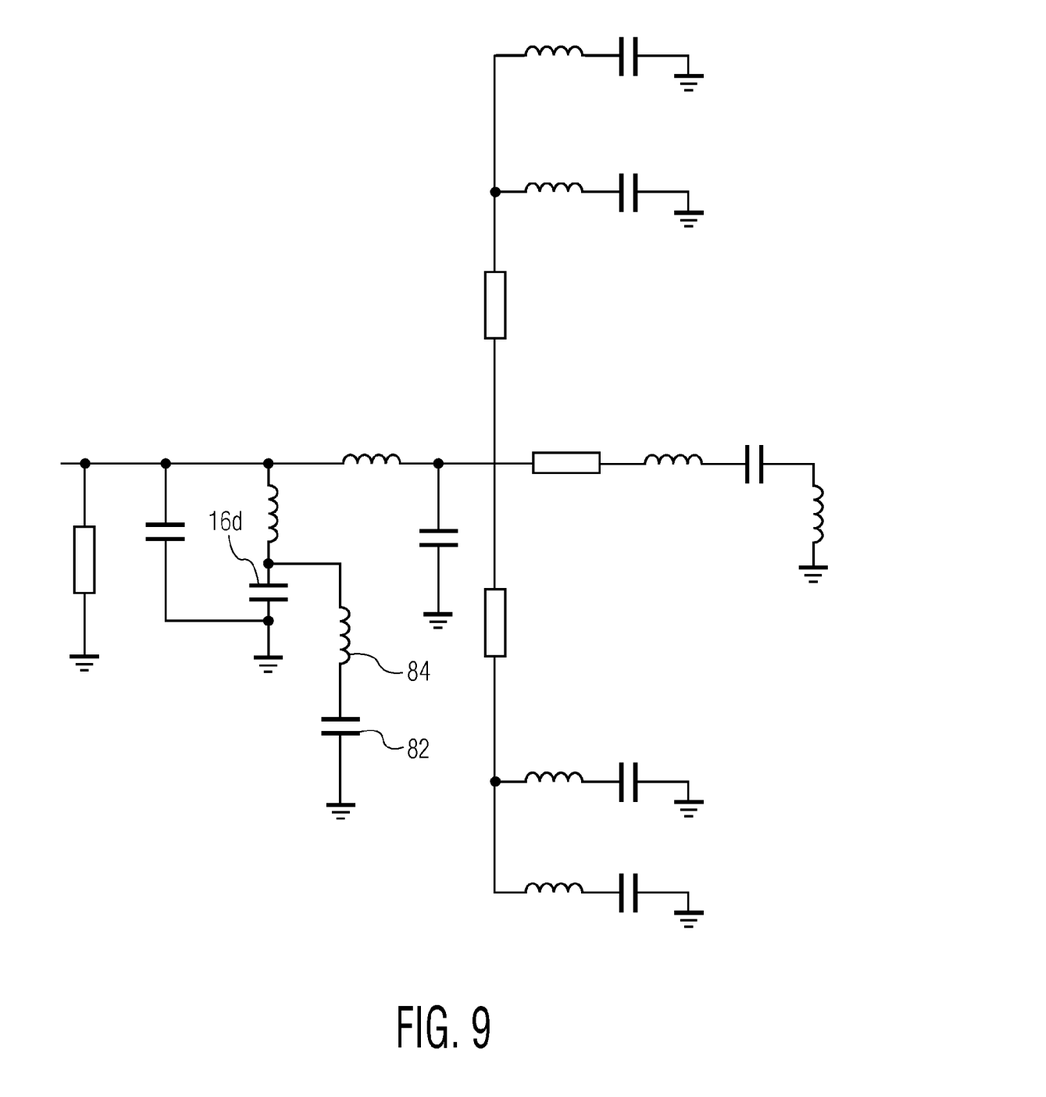
FIG. 9 is a schematic circuit diagram of a packaged RE amplifier circuit according to the embodiment shown in FIGS. 7 and 8.

FIG. 9 is a schematic circuit diagram of a packaged RF amplifier circuit according to the embodiment shown in FIGS. 7 and 8. It will be seen that the circuit of FIG. 9 differs from the conventional circuit of FIG. 5 in that it comprises an additional large value capacitor 82 and low value inductance 84 connected in series between the RF decoupling capacitance 16d and ground.

Figure 10A:
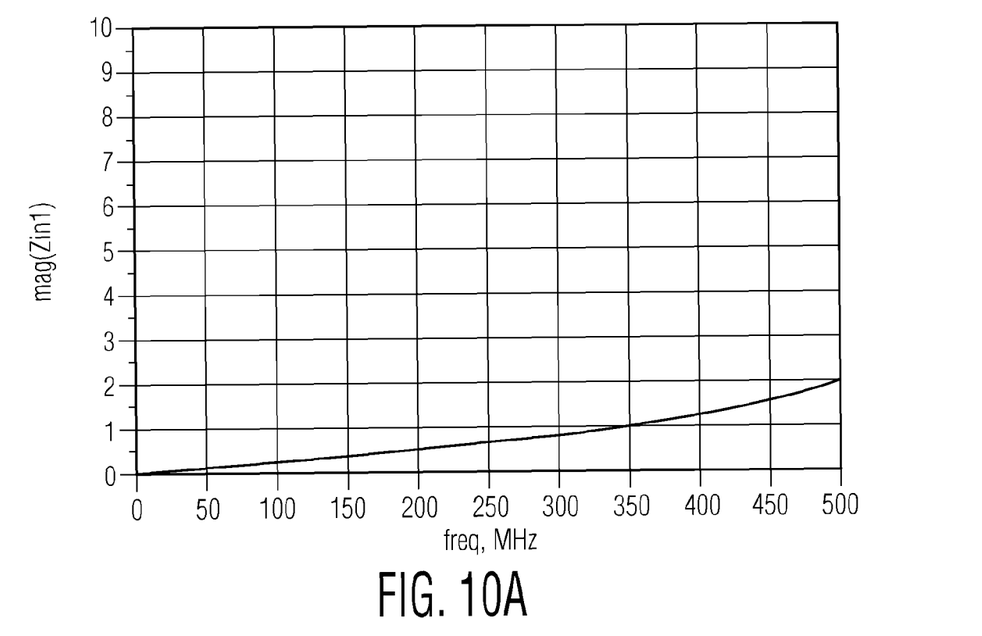
FIG. 10a is a graph illustrating a variation of the magnitude of baseband impedance with operating frequency for the packaged RF amplifier circuit of FIG. 9.
Figure 10B:
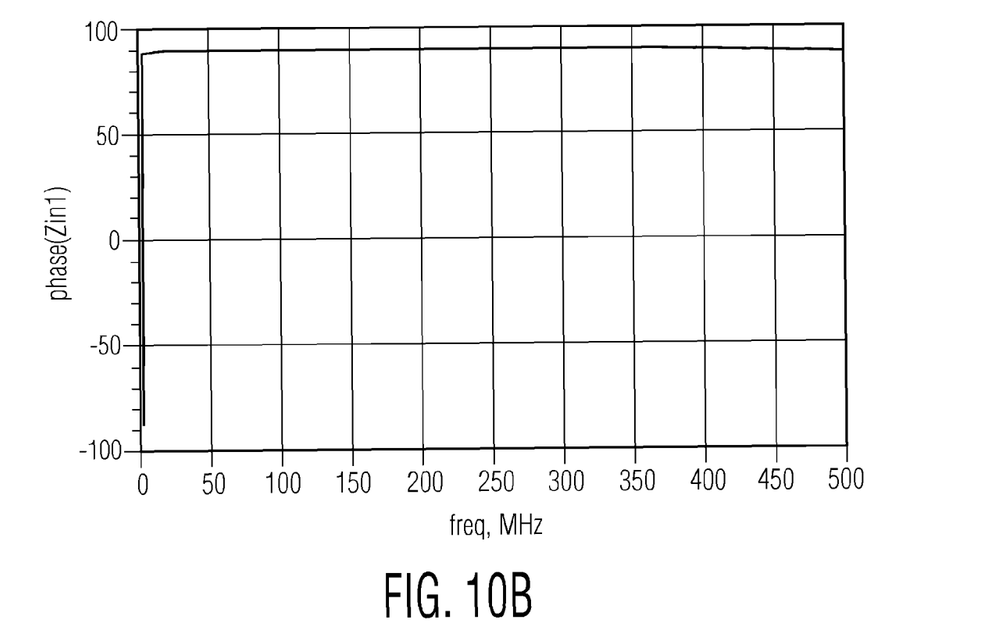
FIG. 10b is a graph illustrating a variation of the phase of baseband impedance with operating frequency for the packaged RF amplifier circuit of FIG. 9.

FIG. 10a is a graph illustrating a variation of the magnitude of baseband impedance with operating frequency for the RF amplifier circuit of FIG. 9. FIG. 10b is a graph illustrating a variation of the phase of baseband impedance with operating frequency for the packaged RF amplifier circuit of FIG. 9. FIGS. 10a and 10b thus illustrate the frequency response of the RF amplifier circuit according to the embodiment of FIGS. 7 and 8. From FIGS. 10a and 10b it will be seen that the resonant frequency of the embodiment of FIGS. 7 and 8 is significantly increased when compared to the conventional circuit of FIG. 5. Embodiments employing the described concept of using the available space of the package cover to form a large value capacitance may therefore have an increased resonant frequency which meets desired video bandwidth requirements for modern applications like mobile telecommunications.

Embodiments enable the realisation of a large value capacitance (in the μF or 10 μF range for example) in the cover of a packaged RF amplifying circuit.

Embodiments also enable the realisation of a low inductance and high capacitance connected to the RF decoupling capacitance on the output side of the amplifying circuit. This may be provided by embedded a large value capacitance in the cover of discrete packaging and/or by the connection of external capacitance (i.e. a capacitance provided outside a packaged amplifier circuit) to the amplifier circuit via DC leads.

Embodiments thus provide RF amplifier circuit arrangements having improved video bandwidth and/or signal distortion performance.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality.

The invention claimed is:

1. A radio frequency (RF) amplifier circuit, comprising
a package having a package flange, a conducting ring and a package cover;
an amplifier circuit, directly under the package cover and directly over the package flange, having a RF decoupling capacitance coupled to the conducting ring,
wherein the package cover includes a capacitor having a first electrode and a second electrode, and
wherein the first electrode coupled to the conducting ring which is coupled to the RF decoupling capacitance; and
wherein the second electrode is coupled to the package flange.

2. The RF amplifier circuit of claim 1, wherein
the capacitor comprises a dielectric layer sandwiched between the first and second electrodes.

3. The RF amplifier circuit of claim 1, wherein the capacitor covers a majority of a side of the package.

4. The RF amplifier circuit of claim 1,
wherein the capacitor is formed to have a capacitance value greater than 0.5 µF.

5. The RF amplifier circuit of claim 1,
wherein the capacitor is connected to the RF decoupling capacitance via a plurality of wire bonds.

6. The RF amplifier circuit of claim 1, further comprising:
a baseband decoupling network connected in parallel with the RF decoupling capacitance.

7. The radio frequency (RF) amplifier circuit of claim 1:
wherein the capacitor is connected to the RF decoupling capacitance via one or more DC coupling leads.

8. The RF amplifier circuit of claim 7,
wherein the one or more DC coupling leads comprise a plurality of parallel wire bonds.

9. An integrated circuit comprising the RF amplifier circuit according to claim 1.

10. A mobile base station comprising the RF amplifier circuit according to claim 1.

11. The RF amplifier circuit of claim 1, wherein the capacitor is connected to the RF decoupling capacitance via a microstrip-like connection.

12. The RF amplifier circuit of claim 4, wherein the capacitor is formed to have a capacitance value greater than 1 µF.

13. The RF amplifier circuit of claim 12, wherein the capacitor is formed to have a capacitance value greater than 3 µF.

14. The RF amplifier circuit of claim 12, wherein the capacitor is formed to have a capacitance value greater than 10 µF.

* * * * *